(12) United States Patent
Choi

(10) Patent No.: US 9,360,761 B2
(45) Date of Patent: Jun. 7, 2016

(54) PHOTORESIST STRIPPING COMPOSITION FOR MANUFACTURING LCD

(75) Inventor: Ho Sung Choi, Gyeonggi-Do (KR)

(73) Assignee: LTC Co., Ltd., Anyang, Gyeonggi-do (KR)

( * ) Notice: Subject to any disclaimer, the term of this patent is extended or adjusted under 35 U.S.C. 154(b) by 1050 days.

(21) Appl. No.: 13/993,278

(22) PCT Filed: Aug. 19, 2010

(86) PCT No.: PCT/KR2010/005494
§ 371 (c)(1),
(2), (4) Date: Sep. 11, 2013

(87) PCT Pub. No.: WO2011/025180
PCT Pub. Date: Mar. 3, 2011

(65) Prior Publication Data
US 2013/0345106 A1    Dec. 26, 2013

(30) Foreign Application Priority Data
Aug. 25, 2009   (KR) .................. 10-2009-0078867

(51) Int. Cl.
G03F 7/42      (2006.01)
C11D 11/00    (2006.01)

(52) U.S. Cl.
CPC ............... *G03F 7/422* (2013.01); *G03F 7/425* (2013.01); *C11D 11/0047* (2013.01)

(58) Field of Classification Search
CPC .................................................. C11D 11/0047
See application file for complete search history.

(56) References Cited

U.S. PATENT DOCUMENTS

| | | | |
|---|---|---|---|
| 6,130,195 A | 10/2000 | Doyel et al. | |
| 6,310,020 B1 | 10/2001 | Shirota et al. | |
| 6,869,921 B2 | 3/2005 | Koito et al. | |
| 2003/0130147 A1* | 7/2003 | Koito et al. | 510/175 |
| 2003/0130149 A1* | 7/2003 | Zhou et al. | 510/176 |
| 2004/0084061 A1* | 5/2004 | Takashima | 134/2 |
| 2007/0212640 A1* | 9/2007 | Sato et al. | 430/270.1 |
| 2010/0190112 A1* | 7/2010 | Wakiya et al. | 430/313 |
| 2012/0181248 A1* | 7/2012 | Park et al. | 216/13 |

FOREIGN PATENT DOCUMENTS

| | | |
|---|---|---|
| EP | 1031884 A2 | 8/2000 |
| EP | 1031884 A3 | 3/2001 |
| JP | 64-081950 | 3/1989 |

(Continued)

OTHER PUBLICATIONS

Office Action for Taiwan Patent Application No. 099128466, dated Jun. 27, 2013.

*Primary Examiner* — Gregory Webb
(74) *Attorney, Agent, or Firm* — Mintz Levin Cohn Ferris Glovsky and Popeo, P.C.; Kongsik Kim; Joohee Lee

(57) ABSTRACT

The present invention relates to a photoresist stripping composition for all process of manufacturing LCD, more specifically to a water-borne united photoresist stripping composition, as a weak basic composite comprising a tertiary alkanolamine, water, and an organic solvent. The composition according to the present invention prevents a corrosion of Al and Cu metal wiring in process of manufacturing LCD, has a good capability of removing photoresist, and is applied to all Al process, Cu process, an organic film process, and COA process.

5 Claims, 3 Drawing Sheets

(56) References Cited

FOREIGN PATENT DOCUMENTS

| | | |
|---|---|---|
| JP | 2000-250230 A | 9/2000 |
| JP | 03-243698 B2 | 1/2002 |
| JP | 2003-068699 A | 3/2003 |
| JP | 2003-114540 A | 4/2003 |
| JP | 2003-262963 A | 9/2003 |
| JP | 2005-043874 A | 2/2005 |
| KR | 10-2005-0008410 A | 1/2005 |
| WO | 2007/037628 A1 | 4/2007 |
| WO | 2009-005014 A1 | 1/2009 |

\* cited by examiner

Photoresist Stripper for Al wiring @70°C 2min. Treatment

Composition Liquid of the Composite 1 to 10 of Table 1 @70°C 2min. Treatment

PHOTORESIST STRIPPING COMPOSITION FOR MANUFACTURING LCD

CROSS-REFERENCES TO RELATED APPLICATIONS

This application is a U.S. national phase application, pursuant to 35 U.S.C. §371, of PCT/KR2010/005494, filed Aug. 19, 2010, designating the United States, which claims priority to Korean Application No. 10-2009-0078867, filed Aug. 25, 2009. The entire contents of the aforementioned patent applications are incorporated herein by this reference.

TECHNICAL FIELD

The present invention relates to a photoresist stripping composition to be used for all process of manufacturing LCD, and more specifically to a good environment-friendly photoresist stripping composition as a weak basic composite having water and a tertiary alkanolamine. The composition has a good capability of inhibiting a copper and aluminum wiring from corrosion and a good removing capability of a photoresist.

BACKGROUND ART

In a flat-panel display (FPD) manufacturing process, a photo-lithography process is in wide used for forming a uniform pattern on a substrate. This photo-lithography process consists of a series of processes which comprise an exposure process, a dry or wet etching process and an ashing process. Generally, the pattern is formed by applying and exposing a photoresist on the substrate, and then carrying out the dry or wet etching process. At this time, a photoresist which is left on a metal wiring is removed using a photoresist stripper.

Until now, a mixture of a primary amines or a secondary amines, and a polar solvent or glycols has mostly used as the photoresist stripping composition for manufacturing LCD. Concretely, Monoethanolamine (MEA) is used as the primary amines, Isopropanolamine (MIPA), etc. has used as the secondary amines, and N-methyllpyrollidone (NMP), Sulfolene or Dmethylsulfoxide (DMSO), etc. is used as the polar solvent. Also Diethyleneglycolmonoethylether (EDG), Diethyleneglycolmonobutylether (BDG), Triethyleneglycolether (TEG), etc. is used as the glycols.

Usually, a photoresist which is left after the etching process is stripped using a stripper and then is washed using water. However, this process brings about a problem wherein impurities are generated because of re-adhesion of the photoresist.

This is the reason that alkanolamine is mixed with water and then hydroxyl ion is generated, thus corrosion to the metal having aluminum considerably increases. Thereby it has needed a special corrosion inhibitor for preventing the corrosion of the metal wiring. However, a prior corrosion inhibitor has the problem that its economic efficiency is low because of its high production cost. Particularly, in manufacturing the Flat-Panel Display like LCD, recently the size of the front surface of the panel has become bigger so that the use of the stripper has increased thereby the rising of the processing cost has been not avoided.

Copper is substituted for aluminum as the material of the metal wiring while the size of the front surface of the panel becomes bigger. However, this brings about the problem that the prior stripper is not applied both to copper and aluminum. In other words, in the TFT-LCD process, until now there is not any photoresist stripper to be able to be all applied to Al process, Cu process, Gate process and COA process.

To solve the problems, the inventors tried to develop all water-borne photoresist stripper by using a tertiary alkanolamine which have not used as the stripper because of its very weak performance of stripping the photoresist. The water-borne photoresist stripper prevents the corrosion of Al and Cu metal wiring, has the good capability of removing the photoresist and may be used to all Al process, Cu process, an organic film process, and COA process.

DISCLOSURE

Technical Problem

To solve the abovementioned problems, the present invention is provided. A technical purpose of the present invention is to develop all water-borne photoresist stripper which prevents the corrosion of Al and Cu metal wiring, has the good capability of removing the photoresist and may be used to all Al process, Cu process, an organic film process, and COA process by using a tertiary alkanolamine.

A purpose of the present invention is providing a photoresist stripping composition using a tertiary alkanolamine which has not been used as the stripper because of its very weak stripping performance with water and a proper organic solvent. The composition of stripper does not corrode the copper wiring and absolutely does not damage a color resist which is exposed in COA (Color filter On Array) process, and may be applied to existing processes (an Al process and a Gate process), that is to say may be used for all processes.

In detail, the photoresist stripping composition of the present invention comprises (a) 1 to 20% by weight of a tertiary alkanolamine of the Formula (I) (b) 1 to 60% by weight of water; and (c) 20 to 98% by weight of the organic solvent which forms a saturated or unsaturated hydrocarbon chain of a 4 to 6 membered ring, which has one more oxygen atoms and which is substituted with a substituent of a hydroxyl ($C_1$-$C_5$) alkyl:

(I)

wherein, R is a linear or a branched-chain $C_1$-$C_6$ alkylene, and X is OH or H.

Technical Solution

The present invention provides a photoresist stripping composition for manufacturing LCD, the composition comprising:

(a) 1 to 20% by weight of a tertiary alkanolamine compound of the formula (I);
(b) 1 to 60% by weight of water; and
(c) 20 to 98% by weight of the organic solvent which forms a saturated or unsaturated hydrocarbon chain of a 4 to 6 membered ring, which has one more oxygen atoms and which is substituted with a substituent of a hydroxyl ($C_1$-$C_5$) alkyl:

(I)

wherein,
R is a linear or branch chained $C_1$-$C_6$ alkylene, and

X is OH or H.

The tertiary alkanolamine which may be used in the present invention is able to substitute primary, secondary amines compounds which are contained in the existing photoresist stripper so that corrode and damage a metal wiring and an organic film or a color resist.

In detail, the tertiary alkanolamine (for example, methyldiethanolamine) which may be used in the present invention is a weak base, corrodes very little the metal wiring, this results from its own unique structure. For example, a copper wiring is generally corroded by a coordination bond with primary, secondary amine, this action mechanism is represented by the following chemical equation.

Forming of a hydroxyl ion: $RNH_2 + H_2O \rightarrow RNH_3^+ + OH^-$ (Loss Electron Pair)

Reaction: $Cu + 6RNH_2 \rightarrow Cu(RNH_2)_6^{2}$

Meanwhile, the tertiary alkanolamine (for example, methyldiethanolamine or methyldimethanolamine) is represented by the following chemical equation.

Forming of a hydroxyl ion: $R_3N + H_2O \rightarrow R_3NH^+ + OH^-$ (Loss Electron Pair)

Reaction: $Cu + 6R_3N \rightarrow Cu(R_3N)_6^{2}$

However, in the tertiary alkanolamine, reaction of the Cu with $R_3N$ is not easy because of solid obstacle of the R(alkyl), therefore there is little the corrosion of the copper wiring through this reaction.

The desired tertiary alkanolamine which may be used in the present invention is a compound selected from the group of methyldiethanolamine, methyldimethanolamine and mixture of these. In detail, the abovementioned desired tertiary alkanolamine which comprises water (1 to 60% by weight) does not corrode the metal wiring and particularly has an excellent selectivity to the copper wiring, unlike a primary or a secondary alkanolamine which is a strong alkali. And additionally it enhances largely the solvency of the photoresist of the organic solvent (c) component used in present invention. Also the primary alkanolamine and the secondary alkanolamine make a stripping liquid go bad because they generate amides and make a side reaction by their hydrogen to be able to breakaway, but the tertiary alkanolamine have the advantage that there are not the problem basically because it has not hydrogen to be able to breakaway.

It is preferable that a ratio of the tertiary alkanolamine to all the composition of the stripper is 1 to 20% by weight In the case of the ratio of the tertiary alkanolamine less than 1% by wt, the photoresist stripping capability is low, and in the case of the ratio exceeded 20% by wt, it increases a viscosity of the stripping liquid so that there may be a problem during a spray work.

It is preferable that a ratio of the water to all the composition of the stripper is 1 to 60% by wt, more preferable 10 to 40% by weight. In the case of the ratio of the water less than 1% by wt, the photoresist stripping capability is low because of the very low basicity of the tertiary alkanolamine itself. In the case of the ratio exceeded 60% by wt, the metal wiring may be corroded and also the photoresist stripping effect falls.

Meanwhile, it is generally known that the tertiary alkanolamine, as a very weak basic amine, has the weaker photoresist stripping capability than the primary alkanolamine and the secondary alkanolamine relatively. But the inventors found that, using the tertiary alkanolamine mixed with an organic solvent (c), which is substituted with hydroxyalkyl and comprises an ether group in the ring, has a good photoresist stripping capability because of the synergistic effect.

Also, this polar organic solvent (c) may enhance the more effect of preventing the corrosion of the metal wiring because of a coordination bond on the surface of the metal in the chemical structure, and has the good detergency that removes impurities in the ionized water cleaning process following the photoresist stripping for manufacturing LCD.

The organic solvent (c) which may be used in the present invention forms a saturated or unsaturated hydrocarbon chain of a 4 to 6 membered ring, which has one more oxygen atoms and which is substituted with a substituent of a hydroxyl ($C_1$-$C_5$) alkyl, The organic solvent (c) is preferably selected from the group consisting of the following compounds and their mixtures:

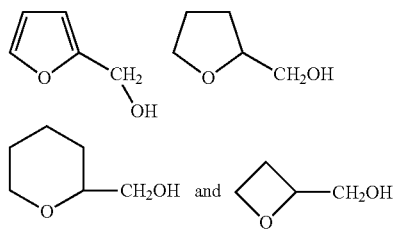

It is preferable that the ratio of the organic solvent (c) which may be used in the present invention is 20 to 98% by wt, more preferably 20 to 80% by weight. The very little content of the organic solvent (c) drops the photoresist solubility. That is to say, in the case that the spray processing proceeds for a long time, its ratio of weight is reduced by exhaust so that it cannot resolve the photoresist thoroughly. Only, because the organic solvent (c) which may be used in the present invention has a high price relatively, there is a disadvantage that the content of organic solvent (c) is smaller, the more cost of the entire process is required.

Meanwhile, in the case of the very severely indurate photoresist by a dry etching, the composite of the present invention cannot be well swelled. Therefore in order to compensate this defect, the following polar solvents may be added additionally. The desired polar solvent in the present invention may be selected from the group consisting of, but not limited to, N-methylpyrrolidone, Sulfolane, Dimethylsulfoxide, Dimehylacetamide, MMF (Monomethylformamide) and their mixtures.

It is preferable that the ratio of the polar solvent is 5 to 80% by weight In the case of the ratio of the polar solvent less than 5% by weight, the indurate photoresist cannot be dissolved well, and there is a disadvantage that the polar solvent is more employed, the more cost of the entire process is required.

Also, a desired composition according to a detailed example of the present invention is as follows:

The photoresist stripping composition, the composition comprising:

(a) 1 to 20% by weight of a tertiary alkanolamine compound of the formula (I);

(b) 1 to 60% by weight of water; and (c) 10 to 98% by weight of the organic solvent which forms a saturated or unsaturated hydrocarbon chain of a 4 to 6 membered ring which has one more oxygen atoms and which is substituted with a substituent of a hydroxyl ($C_1$-$C_5$) alkyl and the residual amount by weight of a polar solvent:

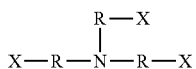

(I)

wherein,
R is a linear or branch chained $C_1$-$C_6$ alkylene, and
X is OH or H.

Also, in mixing the abovementioned organic solvent (c) with one more glycol compound, the photoresist is able to be stripped more effectively. These glycols help the dissolved photoresist be removed quickly by spreading well it to the stripper. The abovementioned glycol compound has the chemical structure of formula represented as R'—O($CH_2CH_2O$)H, wherein R' is a linear, a branched chain, or a cyclic hydrocarbon, that is a branched hydrocarbon, or cyclic hydrocarbon.

A desirable glycol compound which may be used in the present invention is able to be selected in the group consisting of, but not limited to, Diethylenglycolmonomethylether (MDG), Diethylenglycolmonoethylether (EDG), Dethylenglycolmonobutylether (BDG) and Triethylenglycolether (TEG), and their mixtures.

It is preferable that the ratio of glycols is 5 to 80% by weight of all content.

Advantageous Effects

The photoresist stripping composition according to the present invention, firstly, in the process of a flat display panel, has the good capability of removing the photoresist left after a dry etching and a wet etching.

Secondly, it applies simultaneous to a aluminum wiring and a copper wiring to which existing stripping liquid cannot be applied, and may be introduced even to an organic film and COA Process.

Thirdly, it is the environment-friendly stripper which is nontoxic relatively than other alkanolamines photoresist stripping liquid.

BEST MODE

Now, various embodiments of the present invention will be specifically described with reference to the accompanying drawings. The terms or word used in the specifications and claims is not understood in such a way as to interpret limited to general or lexical meaning, but should be understood as meaning and concept coincided with the technical idea of the present invention based on the principle that the inventor can define the concept of the terms for explaining his invention in the best way.

Therefore, drawings described in the specifications and the structures drawn in the embodiments is only an example and does not represent thoroughly the technical ideas of the present invention, thus, it should be understood that numerous the alternatives and equivalent that may be substitute for them at the time of filing of the present invention are intended to be included within-the scope of the present invention.

The following table 1 is the data that its effectiveness is identified by stripping a real photoresist using the numerous possible compositions of the photoresist stripping liquid.

TABLE 1

Embodiments of the compositions of removing the photoresist

| Composition | | | ratio(wt %) | | |
|---|---|---|---|---|---|
| 1 | FA 98% | MDEA 1% | — | DI WATER 1% | — |
| 2 | FA 78% | MDEA 2% | NMP 10% | DI WATER 10% | — |
| 3 | FA 50% | MDEA 10% | NMP 10% | DI WATER 30% | — |
| 4 | FA 25% | MDEA 7% | NMP 10% | DI WATER 48% | MDG 10% |
| 5 | FA 35% | MDEA 5% | NMP 10% | DI WATER 30% | EDG 10% |
| 6 | FA 35% | MDEA + MDMA 5% + 5% | NMP 10% | DI WATER 25% | EDG 10% |
| 7 | FA 35% | MDEA 5% | NMP 10% | DI WATER 30% | DMSO 20% |
| 8 | FA 30% | MDMA 20% | NMP 10% | DI WATER 20% | DMAC 20% |
| 9 | FA 35% | MDMA 5% | NMP 10% | DI WATER 30% | DMF 20% |
| 10 | FA 35% | MDMA 10% | NMP 10% | DI WATER 20% | MMF 25% |

Figure 1:
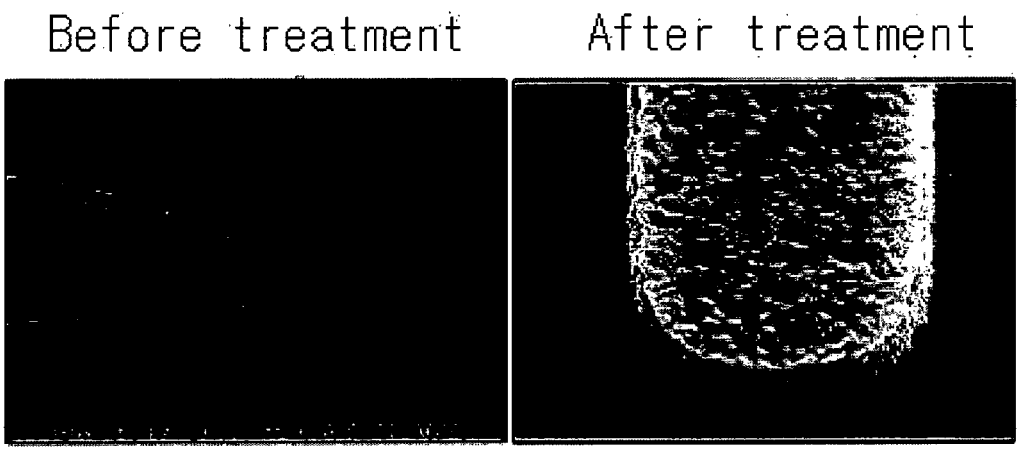
FIG. 1 is a SEM picture before and after treating Al/Mo double wiring substrate which was treated at 40° C. for two minutes by the compositions 1 to 10 in the Table 1.

FA: Furfuryl alcohol
MDEA: Methyldiethanolamine
MDG: Diethyleneglycolmonomethylether
EDG: Diethyleneglycolmonoethylether
BDG: Diethyleneglycolmonobutylether
NMP: N-methylpyrollidone
DMSO: Dimethylsulfoxide
DMAC: Dimethylacetamaide
DMF: Dimethylformamide
MMF: Monomethylformamide
THFA: Tetrahydrofurfurylalcohol
MDMA: Methyldiethanolamine FIG. 1 is a SEM picture before and after treating Al/Mo double wiring substrate which was treated at 40° C. for two minutes by the compositions 1 to 10 in the Table 1. In all the embodiment of using the compositions 1 to 10, there is no any corrosion of Al and the photoresist is removed completely.

Figure 2:
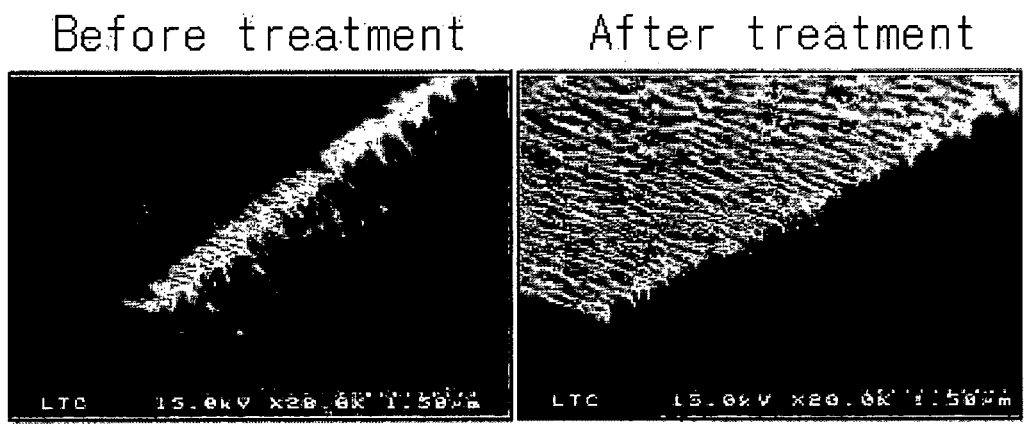
FIG. 2 is a SEM picture before and after treating Mo/Al/Mo triple wiring substrate which was treated at 70° C. for thirty minutes by the compositions 1 to 10 in the Table 1.

FIG. 2 is a SEM picture before and after treating Mo/Al/Mo triple wiring substrate which was treated at 70° C. for thirty minutes by the compositions 1 to 10 in the Table 1. In the case of using the compositions 1 to 10 for a long time, there is no any corrosion of Al wiring.

Figure 3:
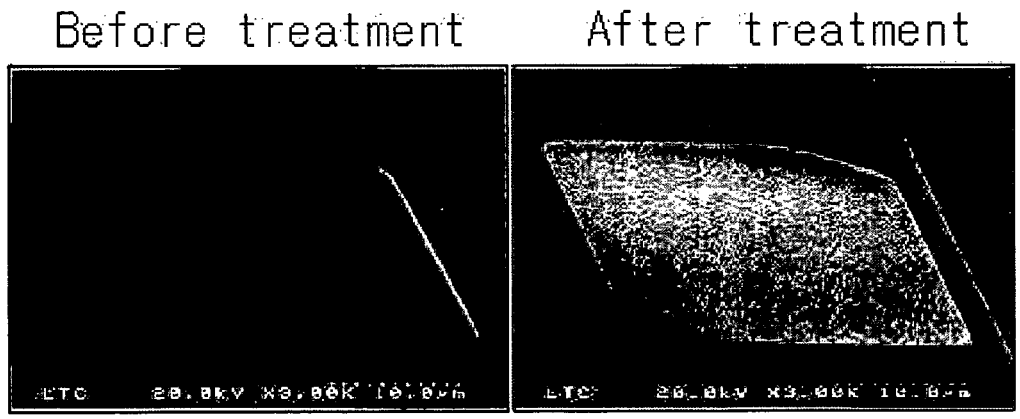
FIG. 3 is a SEM picture before and after treating a dry etching substrate having a weakly indurate photoresist which was treated at 40° C. for two minutes by the compositions 1 to 10 in the Table 1.

FIG. 3 is a SEM picture before and after treating a dry etching substrate having a weakly indurate photoresist which was treated at 40° C. for two minutes by the compositions 1 to 10 in the Table 1. In all the case of using the compositions 1 to 10, the weakly indurate photoresist is removed completely.

Figure 4:
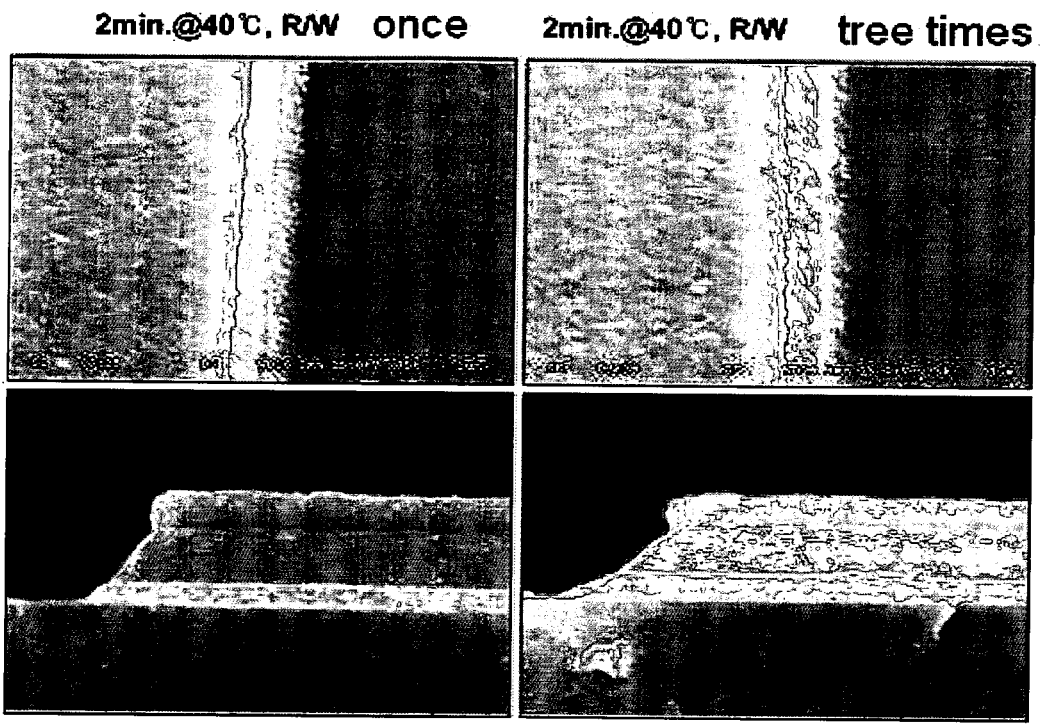
FIG. 4 is a SEM picture before and after treating Mo/Cu/Mo triple film substrate which was treated once and three times at 40° C. for two minutes by the compositions 1 to 10 in the Table 1.

FIG. 4 is a SEM picture before and after treating Mo/Cu/Mo triple film substrate which was treated once and three times at 40° C. for two minutes by the compositions 1 to 10 in the Table 1. In the case of using the compositions 1 to 10 for a long time, there is no any corrosion of Cu wiring.

Figure 5:
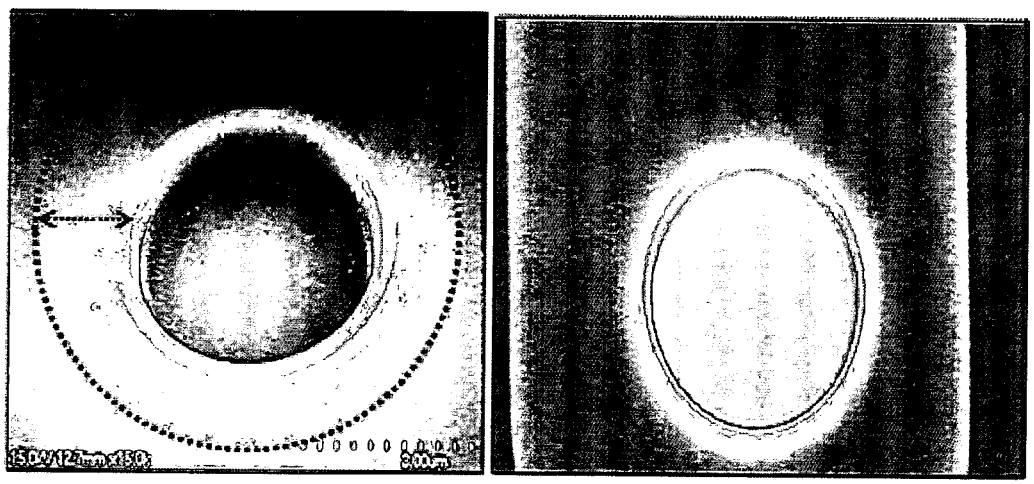
FIG. 5 is a SEM picture before and after treating a dry etching substrate having a severely indurate photoresist which was treated at 40° C. for two minutes by the compositions 1 to 10 in the Table 1.

FIG. 5 is a SEM picture before and after treating a dry etching substrate having a severely indurate photoresist which was treated at 40° C. for two minutes by the compositions 1 to 10 in the Table 1. In the case that it is treated using the compositions 1 to 10, the photoresist is removed completely.

Figure 6:
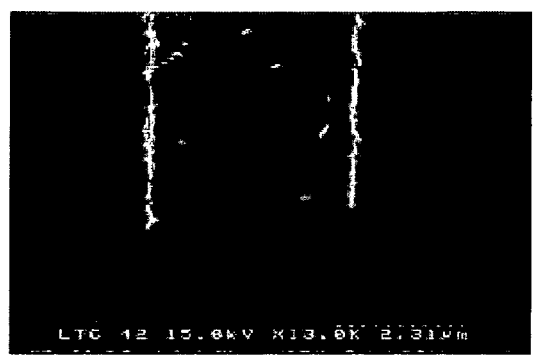
FIG. 6 is a SEM picture of Cu/Ti double film substrate for a photoresist to have been stripped by a LCD photoresist stripper for Al wiring on the market and the compositions 1 to 10 in the Table 1.
Figure 6:

FIG. 6 is a SEM picture of Cu/Ti double film substrate for a photoresist which has been stripped by a LCD photoresist stripper for Al wiring on the market and the compositions 1 to 10 in the Table 1. In the case of using the LCD photoresist stripper for Al wiring on the market, the Cu/Ti film was corroded. But in the embodiment of using the compositions 1 to 10 in the Table 1, there is no any corrosion of Cu/Ti film.

Through the above embodiments, in spite of using a tertiary alkanolamine, water and a furfuryl alcohol, the photoresist was fully removed after etching in the FPD manufacturing process. Also in the case of adding the mixture of glycols and polar solvents, the photoresist stripper has a much stronger ability of removing photoresist and the entire process cost was reduced.

One skilled in the relevant art will recognize that many other equivalents or alternatives in the scope which does not divagate from the present invention are possible. Accordingly, the technical scope of the invention is defined by the appended claims, not the preceding disclosure.

The invention claimed is:

1. A photoresist stripping composition for manufacturing LCD, the composition comprising:
   (a) 1 to 20% by weight of a tertiary alkanolamine compound of the formula (I);
   (b) 10 to 40% by weight of water;
   (c) 20 to 98% by weight of an organic solvent which forms a saturated or unsaturated hydrocarbon chain, of a 4 to 6 membered ring, which has one more oxygen atoms and which is substituted with a substituent of a hydroxyl ($C_1$-$C_5$) alkyl; and
   (d) 5 to 80% by weight based on the composition of a polar solvent which is selected from the group consisting of N-methylpyrollidone, Sulfolane, Dimethylsulfoxide, Dimethylacetamide, MMF (Monoethylformamide), and their mixtures,

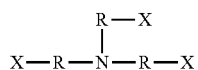
(I)

wherein, R is a linear or branch chained $C_1$-$C_6$ alkylene, and
X is OH or H.

2. The photoresist stripping composition according to claim 1, wherein the tertiary alkanolamine is selected from the group consisting of Methyldiethanolamine, Methyldimethanolamine, and their mixtures.

3. The photoresist stripping composition according to claim 1, wherein the organic solvent is selected from the group consisting the following compounds and their mixtures:

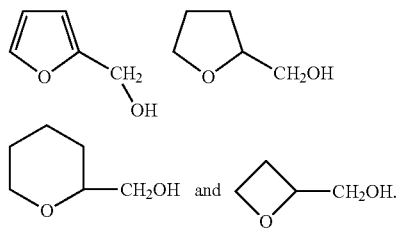

4. The photoresist stripping composition according to claim 1, further comprising 5 to 80% by weight based on the composition of a glycol having the compound of formula of R'—O($CH_2CH_2O$)H,
   wherein
   R' is a linear chained, a branch chained, or a cyclic hydrocarbon, that is a branched hydrocarbon, or a cyclic hydrocarbon.

5. A photoresist stripping composition, the composition comprising:
   (a) 1 to 20% by weight of a tertiary alkanolamine compound of the formula (I);
   (b) 10 to 40% by weight of water;
   (c) 10 to 98% by weight of an organic solvent which forms a saturated or unsaturated hydrocarbon chain of a 4 to 6 membered ring which has one more oxygen atoms and which is substituted with a substituent of a hydroxyl ($C_1$-$C_5$) alkyl and the residual amount by weight of a polar solvent; and
   (d) 5 to 80% by weight based on the composition of a polar solvent which is selected from the group consisting of N-methylpyrollidone, Sulfolane, Dimethylsulfoxide, Dimethylacetamide, MMF (Monoethylformamide), and their mixtures,

(I)

wherein,
R is a linear or branch chained $C_1$-$C_6$ alkylene, and
X is OH or H.

* * * * *